US010297605B2

(12) United States Patent
 Wang

(10) Patent No.: US 10,297,605 B2
(45) Date of Patent: May 21, 2019

(54) HYBRID ELECTRONICALLY ERASABLE PROGRAMMABLE READ-ONLY MEMORY (EEPROM) SYSTEMS AND METHODS FOR FORMING RELATED APPLICATIONS

(71) Applicant: Allegro MicroSystems, LLC, Manchester, NH (US)

(72) Inventor: Yigong Wang, Rutland, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/913,286

(22) Filed: Mar. 6, 2018

(65) Prior Publication Data
 US 2018/0366479 A1     Dec. 20, 2018

Related U.S. Application Data

(63) Continuation of application No. 15/624,886, filed on Jun. 16, 2017, now Pat. No. 10,038,001.

(51) Int. Cl.
 *H01L 27/11521*    (2017.01)
 *H01L 27/11558*    (2017.01)
 (Continued)

(52) U.S. Cl.
 CPC .. *H01L 27/11521* (2013.01); *H01L 27/11558* (2013.01); *H01L 27/11541* (2013.01); *H01L 27/11543* (2013.01)

(58) Field of Classification Search
 CPC ......... H01L 27/11519; H01L 27/11558; H01L 27/1156
 See application file for complete search history.

(56) References Cited

U.S. PATENT DOCUMENTS 7,102,188 B1    9/2006  Yao et al.
7,633,115 B2   12/2009  Wang
(Continued)

OTHER PUBLICATIONS

Notice of Allowance dated May 29, 2018 for U.S. Appl. No. 15/624,886; 10 pages.
(Continued)

*Primary Examiner* — Bryan R Junge
(74) *Attorney, Agent, or Firm* — Daly, Crowley, Mofford & Durkee, LLP

(57) ABSTRACT

Systems, methods, and techniques described here provide for a hybrid electrically erasable programmable read-only memory (EEPROM) that functions as both a single polysilicon EEPROM and a double polysilicon EEPROM. The two-in-one hybrid EEPROM can be programmed and/or erased as a single polysilicon EEPROM and/or as a double polysilicon EEPROM. The hybrid EEPROM memory cell includes a programmable capacitor disposed on a substrate. The programmable capacitor includes a floating gate forming a first polysilicon layer, an oxide-nitride-oxide (ONO) layer having disposed over a first surface of the floating gate, and a control gate forming a second polysilicon layer with the control gate formed over a first surface of the ONO layer to form a hybrid EEPROM having a single polysilicon layer and a double polysilicon EEPROM. The single polysilicon EEPROM includes the first polysilicon layer and the double polysilicon EEPROM includes the first and second polysilicon layers.

25 Claims, 7 Drawing Sheets

(51) Int. Cl.
*H01L 27/11541* (2017.01)
*H01L 27/11543* (2017.01)

(56) References Cited

U.S. PATENT DOCUMENTS

| | | | |
|---|---|---|---|
| 7,715,219 B2 | 5/2010 | Monreal | |
| 7,719,048 B1* | 5/2010 | Babcock | H01L 27/11519 |
| | | | 257/316 |
| 7,919,807 B1* | 4/2011 | Babcock | H01L 21/28273 |
| | | | 257/315 |
| 8,421,144 B2 | 4/2013 | Kang | |
| 2001/0025980 A1 | 10/2001 | Bottini et al. | |
| 2002/0064921 A1 | 5/2002 | Kato et al. | |
| 2003/0206437 A1 | 11/2003 | Diorio et al. | |
| 2004/0206999 A1* | 10/2004 | Hyde | H01L 27/11519 |
| | | | 257/312 |
| 2004/0253827 A1 | 12/2004 | Hendriks et al. | |
| 2009/0059664 A1 | 3/2009 | Lee et al. | |
| 2010/0157669 A1 | 6/2010 | Audzeyeu et al. | |
| 2010/0165746 A1* | 7/2010 | Jung | G11C 16/0416 |
| | | | 365/185.29 |
| 2011/0169064 A1* | 7/2011 | Chou | H01L 21/84 |
| | | | 257/298 |
| 2011/0193156 A1 | 8/2011 | Dong | |

OTHER PUBLICATIONS

U.S. Non-Final Office Action dated Dec. 7, 2017 for U.S. Appl. No. 15/624,886; 14 pages.
Response to U.S. Non-Final Office Action dated Dec. 7, 2017 for U.S. Appl. No. 15/624,886; Response filed on Mar. 6, 2018; 14 pages.
U.S. Appl. No. 15/624,886, filed Jun. 16, 2017, Wang.
Invitation pursuant to Rule 62a(1) EPC dated Nov. 14, 2018 for International Application No. 18176686.6; 2 Pages.
Extended European Search Report dated Jan. 22, 2019 for European Application No. 18176686.6; 8 pages.
Office Action dated Feb. 14, 2019 for Taiwan Application No. 107118288 with English Translation; 16 Pages.

* cited by examiner

HYBRID ELECTRONICALLY ERASABLE PROGRAMMABLE READ-ONLY MEMORY (EEPROM) SYSTEMS AND METHODS FOR FORMING RELATED APPLICATIONS

RELATED APPLICATIONS

This present application is continuation of U.S. patent application Ser. No. 15/624,886, titled "HYBRID ELECTRICALLY ERASABLE PROGRAMMABLE READ-ONLY MEMORY (EEPROM) SYSTEMS AND METHODS FOR FORMING SYSTEMS AND METHODS TO SECURE A VIRTUAL APPLIANCE" filed Jun. 16, 2017, which is incorporated herein by reference in its entirety for any and all purposes.

BACKGROUND

As is known in the art, an electrically erasable programmable read-only memory (EEPROM) is a type of non-volatile memory used in computers and other electronic devices to store relatively small amounts of data but allowing individual bytes to be erased and reprogrammed. The EEPROM can be erased and reprogrammed (written to) repeatedly through the application of higher than normal electrical voltage. In contrast to read-only memory (ROM) chips, the EEPROM can be selectively erased and reprogrammed and thus the entire EEPROM chip does not need to be erased at one time. Further, EEPROMs can be reprogrammed without removing them from the computer or electronic device they are utilized within.

SUMMARY

Systems, methods, and techniques described here provide for a hybrid electrically erasable programmable read-only memory (EEPROM) that functions as both a single polysilicon EEPROM and a double polysilicon EEPROM. The two-in-one hybrid EEPROM can be programmed and/or erased as a single polysilicon EEPROM and/or as a double polysilicon EEPROM.

The hybrid EEPROM includes two polysilicon layers separated by an oxide-nitride-oxide (ONO) layer. The first (or bottom) polysilicon layer can function as a floating gate (or gate polysilicon) of the hybrid EEPROM and the second (or top) polysilicon layer can function as a control gate of the hybrid EEPROM.

Thus, the hybrid EEPROM described herein provides a unique structure than can function as a single polysilicon EEPROM or a double polysilicon EEPROM with the second polysilicon layer engaged. For example, in single polysilicon EEMPROM operation, the programming and/or erase functions can be performed between the first polysilicon layer (bottom layer) and a drain of a metal oxide silicon (MOS) transistor structure that the hybrid EEPROM is formed within. In double polysilicon EEPROM operation, the programming and/or erase can be between the second polysilicon layer (top layer) and the first polysilicon layer (bottom layer). The hybrid EEPROM may include read and select gate structures can be used in either the single polysilicon EEPROM or a double polysilicon EEPROM operation.

In an embodiment, the hybrid EEPROM can provide benefits for monitoring and/or detecting process related issues for double polysilicon EEPROM applications as the single polysilicon EEPROM is functional while the double polysilicon EEPROM is being utilized or tested.

In a first aspect, a hybrid EEPROM memory cell includes a programmable capacitor disposed on a substrate. The programmable capacitor includes a floating gate forming a first polysilicon layer, the floating gate having first and second opposing surfaces, an oxide-nitride-oxide (ONO) layer having disposed over the first surface of the floating gate, the ONO layer having first and second opposing surfaces and a control gate forming a second polysilicon layer with the control gate formed over the first surface of the ONO layer to form a hybrid EEPROM having a single polysilicon layer and a double polysilicon EEPROM. The single polysilicon EEPROM includes the first polysilicon layer and the double polysilicon EEPROM comprising the first and second polysilicon layers.

The memory cell may further include a first N-type region formed over a first surface of the substrate, a first P-type region formed over a first surface of the first N-type region, and a second P-type region formed over a first surface of the first P-type region, wherein the first and second P-type regions have different doping levels. A second N-type region may be formed over a first surface of the second P-type region and a third N-type region extending into the second N-type region.

In some embodiments, the third and fourth P-type regions extending into the second N-type region such that the third and fourth P-type regions form borders of the second N-type region and are disposed at opposite ends of the second N-type region with respect to each other. An oxide layer may be formed over a first surface of the third N-type region such that the oxide layer is disposed between the first surface of the third N-type region and the second surface of the floating gate.

First and second shallow trench isolation (STI) regions may be formed into portions of the third N-type region, second N-type region, third P-type region and fourth P-type region, wherein the first and second STI regions are formed at opposite ends of the memory cell. In some embodiments, fourth and fifth N-type regions may be formed in the third N-type region such that the fourth N-type region is formed between the first STI region and the floating gate and the fifth N-type region is formed between the floating gate and the second STI region.

An inter-level-dielectric (ILD) layer may be disposed over a first surface of the first and second STI regions, fourth and fifth N-type regions, the first surface of the control gate and portions of the first surface of the ONO layer. Vias may be formed in the ILD layer to couple metal contacts to the programming capacitor, wherein a first metal contact is coupled to the control gate through a first via, a second metal contact is coupled to the fourth N-type region through a second via and a third metal contact is coupled to the fifth N-type region through a third via.

In some embodiments, the substrate may include a p-type substrate.

In another aspect, a method for forming a hybrid EEPROM memory cell includes forming a programmable capacitor on a substrate. Forming the programmable capacitor includes forming a floating gate having a first polysilicon layer, with the floating gate having first and second opposing surfaces, disposing an oxide-nitride-oxide (ONO) layer over the first surface of the floating gate, the ONO layer having first and second opposing surfaces and forming a control gate having a second polysilicon layer. The control gate can be formed over the first surface of the ONO layer to form a hybrid EEPROM comprising a single polysilicon layer and a double polysilicon EEPROM, with the single polysilicon EEPROM including the first polysilicon layer and the double polysilicon EEPROM including the first and second polysilicon layers.

The method may further include forming a first N-type region over a first surface of the substrate, disposing a first P-type region over a first surface of the first N-type region, and disposing a second P-type region over a first surface of the first P-type region such that the first and second P-type regions are formed having different doping levels. A second N-type region may be disposed over a first surface of the second P-type region. A third N-type region may be formed such that it extends into a portion of the second N-type region.

In some embodiments, third and fourth P-type regions can be formed into portions of the second N-type region such that the third and fourth P-type regions form borders of the second N-type region and are disposed at opposite ends of the second N-type region with respect to each other. An oxide layer may be disposed over a first surface of the third N-type region such that the oxide layer is disposed between the first surface of the third N-type region and the second surface of the floating gate.

First and second shallow trench isolation (STI) regions may be formed into portions of the third N-type region, second N-type region, third P-type region and fourth P-type region, wherein the first and second STI regions are formed at opposite ends of the memory cell. Fourth and fifth N-type regions may be formed into portions of the third N-type region such that the fourth N-type region is formed between the first STI region and the floating gate and the fifth N-type region is formed between the floating gate and the second STI region. An inter-level-dielectric (ILD) layer may be disposed over a first surface of the first and second STI regions, fourth and fifth N-type regions, the first surface of the control gate and portions of the first surface of the ONO layer.

Vias may be formed in the ILD layer to couple metal contacts to the programming capacitor. A first metal contact can be coupled to the control gate through a first via, a second metal contact can be coupled to the fourth N-type region through a second via and a third metal contact can be coupled to the fifth N-type region through a third via.

In another aspect, a hybrid electrically EEPROM memory cell includes a means for programming the memory cell disposed on a substrate. The means for programming the memory cell includes a first means for modifying the memory cell having a first polysilicon layer, with the first means for modifying having first and second opposing surfaces, a means for isolating disposed over the first surface of the first means for modifying, the means for isolating having first and second opposing surfaces, and a second means for modifying the memory cell having a second polysilicon layer and disposed over the first surface of the means for isolating to form a hybrid EEPROM having a single polysilicon layer and a double polysilicon EEPROM. The single polysilicon EEPROM includes the first polysilicon layer and the double polysilicon EEPROM includes the first and second polysilicon layers.

The memory cell may include a first N-type region formed over a first surface of the substrate, a first P-type region formed over a first surface of the first N-type region, and a second P-type region formed over a first surface of the first P-type region, such that the first and second P-type regions have different doping levels.

A second N-type region can be formed over a first surface of the second P-type region, a third N-type region can extend into the second N-type region, and third and fourth P-type regions can extend into the second N-type region such that the third and fourth P-type regions form borders of the second N-type region and are disposed at opposite ends of the second N-type region with respect to each other.

The memory cell may include an oxide layer formed over a first surface of the third N-type region such that the oxide layer is disposed between the first surface of the third N-type region and the second surface of the floating gate, first and second shallow trench isolation (STI) regions formed into portions of the third N-type region, second N-type region, third P-type region and fourth P-type region, such that the first and second STI regions are formed at opposite ends of the memory cell, and fourth and fifth N-type regions formed in the third N-type region such that the fourth N-type region is formed between the first STI region and the floating gate and the fifth N-type region is formed between the floating gate and the second STI region.

An inter-level-dielectric (ILD) layer can be disposed over a first surface of the first and second STI regions, fourth and fifth N-type regions, the first surface of the control gate and portions of the first surface of the ONO layer. Vias may be formed in the ILD layer to couple metal contacts to the programming capacitor, wherein a first metal contact is coupled to the control gate through a first via, a second metal contact is coupled to the fourth N-type region through a second via and a third metal contact is coupled to the fifth N-type region through a third via.

BRIEF DESCRIPTION OF THE DRAWINGS

The foregoing features may be more fully understood from the following description of the drawings in which.

DETAILED DESCRIPTION

Figure 1:
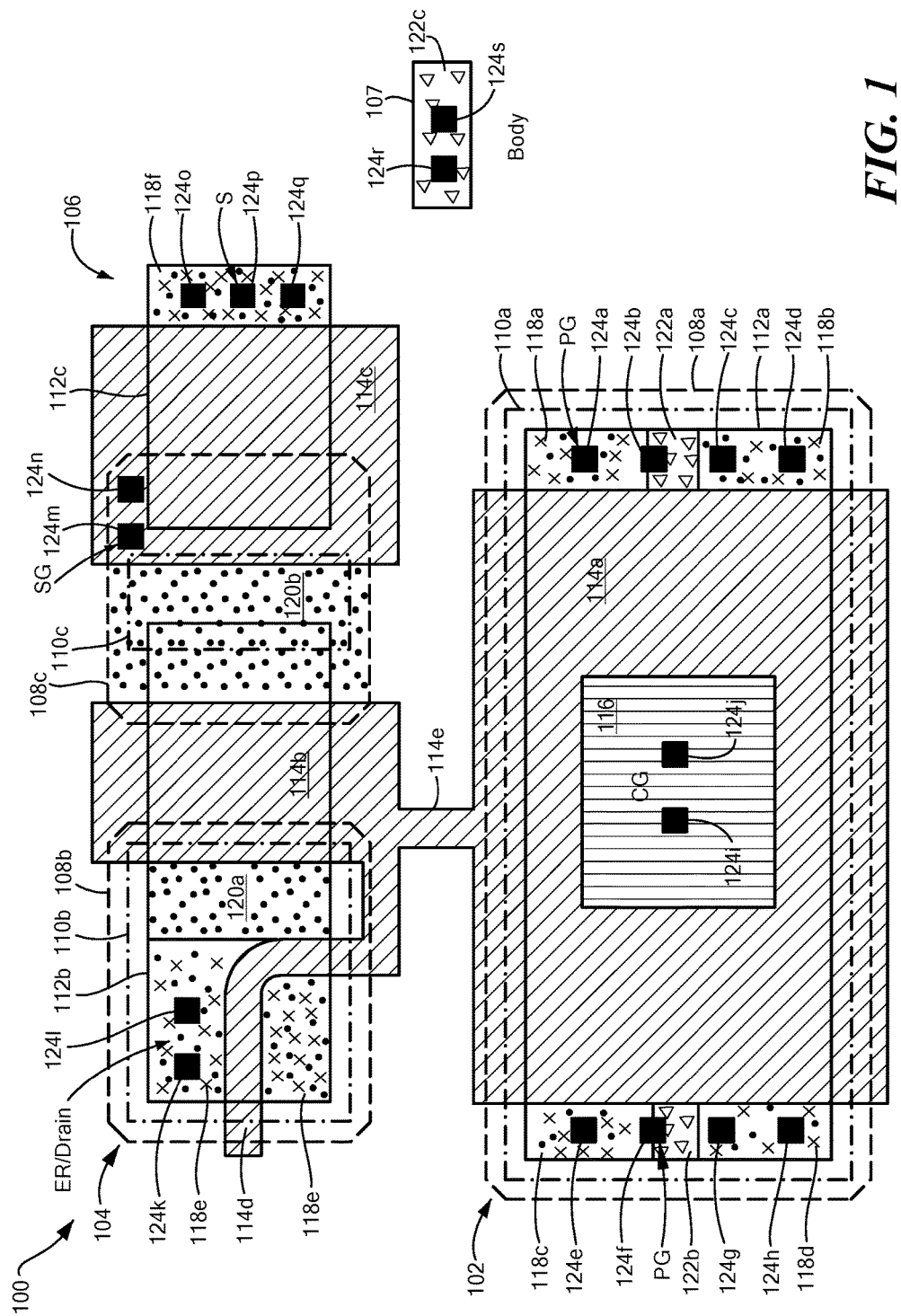
FIG. 1 is a block diagram of a top view of a hybrid electrically erasable programmable read-only memory (EEPROM)

As used herein, the term "P-well" is used to describe a P-type doping, and the term "N-well" is used to describe an N-type doping. As used herein, the terms "P−," "P-minus," "P+," "P-plus" or "middle P-type" are used to describe a P-type doping. Similarly, as used herein, the terms "N−," "N-minus," "N+," or "N-plus" are used to describe an N-type doping. As used herein, the terms "P-type barrier layer" or "PBL" are used to describe a P-type doping. As used herein, the terms "N-type barrier layer" or "NBL" are used to describe an N-type doping.

As used herein, the terms "N-epi" or simply "epi" are used to describe an N-type doping. It should be appreciated that the N-epi layer can be "grown" on the substrate. As used herein, the terms "lightly-doped drain" or simply "LDD" are used to describe a layer having a doping, in the drain or in the source region of a metal oxide semiconductor (MOS) transistor. The LDD described herein may be doped with N-type elements.

As used herein, the terms "polysilicon" or simply "poly" are used to describe a poly-crystalline semiconductor layer, which can be used, for example, as a conductive gate material in MOSFET and CMOS processing technologies.

The poly layer can be deposited, for example, using low-pressure chemical vapor deposition (LPCVD) techniques. The poly layer can also be formed using other techniques. The poly layer can be heavily doped with N-type or P-type doping.

It should be appreciated that each of the doped regions as described herein may include either a N-type or P-type doped region of varying doping levels. For example, N-type regions may refer to at least one of an N(+) type region, an N(−) type region, N-type well or N-type epitaxial layer. P-type regions may refer to at least one of a P(+) type region, a P(−) type region, P-type well, middle P-type or P-type epitaxial layer.

As used for clarity herein, the term "region" may be used to describe portions of a semiconductor device that are implanted (or otherwise disposed) beneath a surface, e.g., a surface of a substrate (e.g., silicon substrate). Conversely, as used herein, the term "layer" is used to describe portions of a semiconductor device that are grown or deposited (or otherwise disposed) above a surface, e.g., a surface of the substrate.

A hybrid electrically erasable programmable read-only memory (EEPROM) that functions as both a single polysilicon EEPROM and a double polysilicon EEPROM is described herein. The two-in-one hybrid EEPROM can be programmed and/or erased as a single polysilicon EEPROM and/or as a double polysilicon EEPROM. The hybrid EEPROM memory cell includes a programmable capacitor disposed on a substrate. The programmable capacitor includes a floating gate forming a first polysilicon layer, an oxide-nitride-oxide (ONO) layer having disposed over a first surface of the floating gate, and a control gate forming a second polysilicon layer with the control gate formed over a first surface of the ONO layer to form a hybrid EEPROM having a single polysilicon layer and a double polysilicon EEPROM. The single polysilicon EEPROM includes the first polysilicon layer and the double polysilicon EEPROM includes the first and second polysilicon layers.

The structure of the hybrid EEPROM allows for the EEPROM to function as a single polysilicon EEPROM or a double polysilicon EEPROM with the second polysilicon layer engaged. In single polysilicon EEMPROM operation, the programming and/or erase functions can be performed between the first polysilicon layer (bottom layer) and a drain of a metal oxide silicon (MOS) transistor structure that the hybrid EEPROM is formed within. In double polysilicon EEPROM operation, the programming and/or erase can be between the second polysilicon layer (top layer) and the first polysilicon layer (bottom layer).

Referring to FIG. 1, a hybrid EEPROM cell 100 includes a programming region 102, a drain region 104 (e.g., erase region), a select region 106 and a body region 107. In an embodiment, hybrid EEPROM cell 100 may include or otherwise be formed as part of a N-type metal oxide semiconductor (NMOS) structure. Thus, in such an embodiment, programming region 102 may include a gate node of the NMOS structure, drain region 104 may include a drain node and/or read node of the NMOS structure, select region 106 may include a source node of the NMOS structure and body 107 may include a body node of the NMOS structure. Some features of drain region 104 and programming region 102 are described in more detail below in conjunction with FIGS. 2 and 3, respectively.

The programming region 102 includes a first outer region 108a, a first inner region 110a and a first device region 112a. The first outer region 108a includes a combination of layers or a stack of layers of different doping types and doping levels. For example, in some embodiments, first outer region 108a is a stack of layers having P-type well region formed over a first surface of a middle P-type region, the middle P-type region formed over a first surface of a P-type buried layer (e.g., PBL), and the P-type buried layer formed over a first surface of a N-type buried layer (e.g., NBL). In some embodiments, the N-type buried layer can be formed over a first surface of a substrate (e.g., substrate 202 of FIG. 2, substrate 302 of FIG. 3).

First inner region 110a includes a combination of layers or a stack of layers of different doping types and doping levels. For example, in some embodiments, inner region 110 is a stack of layers having N-type well region formed over a first surface of a N-type epitaxial layer, the N-type epitaxial layer formed over a first surface of a middle P-type region, the middle P-type region formed over a first surface of a P-type buried layer, the P-type buried layer formed over a first surface of a N-type buried layer. In an embodiment, first inner region 110a can be formed over first outer region 108a. Thus, in such an embodiment, the stack of layers of first inner region 110a can be formed over the stack of layers of first outer region 108a. Illustrative embodiments of the various stack of layers are provided below with respect to FIGS. 2 and 3.

First device region 112a can be formed over first inner region 110a. In some embodiments, first device region 112a can be separated from first inner region 110a or portions of first inner region 110a by one or more shallow trench isolation (STI) regions. First device region 112a can include dielectric material, such as but not limited to an inter-level dielectric (ILD) layer. In some embodiments, first device region 112a may be referred to as an active region.

Hybrid EEPROM cell 100 includes a floating gate region 114 and a control gate region 116. In an embodiment, control gate 116 can be formed generally over floating gate region 114 with an oxide-nitride-oxide (ONO) layer formed between control gate region 116 and a first floating gate region 114a.

Alternating implant regions may be formed over a first surface of inner region 108 and at opposing ends of first floating gate region 114a. For example, and as illustrated in FIG. 1, a first NP/NE implant region 118a, a first P-type implant region 122a, and a second NP/NE implant region 118b may be formed on a first side of first floating gate region 114a. A third NP/NE implant region 118c, a second P-type implant region 122b, and a fourth NP/NE implant region 118d may be formed on a second, different side of first floating gate region 114a. Each of the NP/NE implant regions 118 described herein may include a N+ source/drain implant region formed over a first surface of a N-type lightly doped drain (LDD) region. Each of the P-type implant regions described herein may include a P+ source/drain implant region.

One or more contacts 124a-124h (e.g., metal contact pads) may be formed through device layer 112a and couple to one of NP/NE implant regions 118 or P-type implant regions 122 through one or more vias. In the illustrative embodiment of FIG. 1, a first contact 124a and a second contact 124b are coupled to first NP/NE implant region 118a and a third contact 124c and a fourth contact 124d are coupled to second NP/NE implant region 118b. In an embodiment, a fifth contact 124e and a sixth contact 124f are coupled to third NP/NE implant region 118c and a seventh contact 124g and an eighth contact 124h are coupled to fourth NP/NE implant region 118d.

A ninth contact 124*i* and a tenth contact 124*j* can be formed through first device layer 112*a* and couple to one of control gate 116, each through a via.

In an embodiment, at least one of first contact 124*a*, second contact 124*b*, third contact 124*c* and fourth contact 124*d* may operate as a programming gate terminal. In some embodiments, at least one fifth contact 124*e*, sixth contact 124*f*, seventh contact 124*g* and eighth contact 124*h* may operate as a programming gate terminal. For example, during single polysilicon EEPROM operations, at least one of contacts 124*a*-124*h* may be used as a programming gate terminal.

In some embodiments, for example, during double polysilicon, at least one of ninth contact 124*i* and tenth contact 124*j* may operate as a programming gate. Thus, hybrid EEPROM cell 100 can be configured to function as both a single polysilicon EEPROM and a double polysilicon EEPROM. The two-in-one hybrid EEPROM can be programmed as a single polysilicon EEPROM and/or as a double polysilicon EEPROM in a single structure.

Drain region 104 includes a second outer region 108*b*, a second inner region 110*b* and a second device region 112*b*. In an embodiment, each of second outer region 108*b*, second inner region 110*b* and second device region 112*b* may be the same as or substantially similar to first outer region 108*a*, first inner region 110*a* and first device region 112*a* and include the same or substantially similar stack of layers.

A fifth NP/NE region 118*e* and a first N-type LDD region 120*a* may be formed over a first surface of second inner region 110*b*. An eleventh contact 124*k* and a twelfth contact 124*l* can be formed through second device layer 112*b* and couple to fifth NP/NE region 118*e* through vias respectively.

A second floating gate region 114*b* may be formed such that it is generally between drain region 104 and select region 106, with portions of second floating gate region 114*b* extending into each of drain region 104 and select region 106. For example, and as illustrated in FIG. 1, a finger portion 114*d* of second floating gate region 114*b* may extend over fifth NP/NE region 118*e*.

Second floating gate region 114*b* can be coupled (e.g., directly) to first floating gate region through a liner region 114*e*. Thus, programming region 102 may be coupled to drain region 104 through liner region 114*e*. In an embodiment, liner region 114*e* may include the same material as first and second floating gate regions 114*a*, 114*b*. In one embodiment, liner region 114*e* may include a polysilicon link.

In operation, drain region 104 can operate as a drain terminal, read terminal and/or an erase capacitor for hybrid EEPROM cell 100.

Select region 106 includes a third outer region 108*c*, a third inner region 110*c* and a third device region 112*c*. In an embodiment, each of third outer region 108*c*, third inner region 110*c* and third device region 112*c* may be the same as or substantially similar to first outer region 108*a*, first inner region 110*a* and first device region 112*a* and include the same or substantially similar stack of layers.

A second N-type LDD region 120*b* may be formed over third inner region 110*c*. Second N-type LDD region 120*b* may be formed such that portions of second N-type LDD region 120*b* extend to second floating gate region 114*b* and a third floating gate region 114*c*. Thus, select region 106 may be isolated from other portions of Hybrid EEPROM cell 100. For example, in some embodiments, second and third floating gate regions 114*b*, 114*c* may not be directly coupled together.

A thirteenth contact 124*m* and a fourteenth contact 124*n* can be formed through third device layer 112*c* and couple to third floating gate region 114*c* through vias respectively.

A sixth NP/NE region 118*f* can be formed adjacent to third floating gate region 114*c* (e.g., opposite side from second N-type LDD region 120*b*). A fifteenth contact 124*o*, a sixteenth contact 124*p* and a seventeenth contact 124*q* can be formed through third device layer 112*c* and couple to sixth NP/NE region 118*f* through vias respectively. In an embodiment, a at least one of fifteenth contact 124*o*, sixteenth contact 124*p* and seventeenth contact 124*q* can be used as a source node of the NMOS structure.

In operation, select region 106 can operate as a select gate and/or source terminal for hybrid EEPROM cell 100.

Body region 107 may include a third P+ source/drain implant region 122*c* and eighteenth contact 124*r* and nineteenth contact 124*s* may be formed such that they couple to third P+ source/drain implant region 122*c* through vias respectively. Body region 107 may operate as a body terminal for hybrid EEPROM cell 100.

Figure 2:
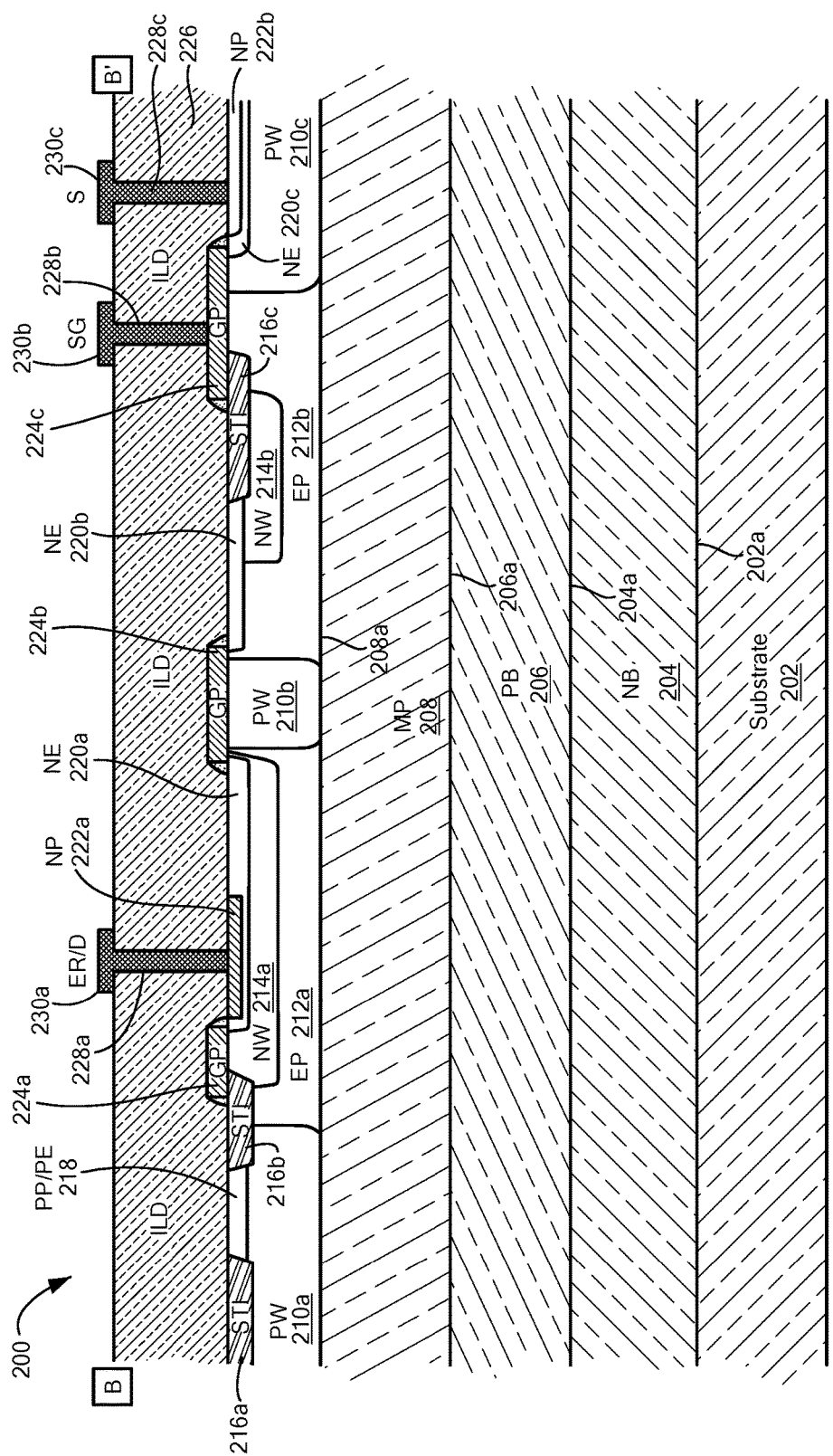
FIG. 2 shows a cross section of an erase capacitor of the HYBRID EEPROM OF FIG. 1 and a read terminal of a N-type metal oxide semiconductor (NMOS) structure.

Now referring to FIG. 2, an erase capacitor 200, that can be the same or substantially similar to drain region 104 of FIG. 1, is provided.

Erase capacitor 200 can be formed on a substrate 202. A n-type buried layer (NBL) 204 can be formed on a first surface 202*a* of substrate 202. A p-type buried layer (PBL) 206 can be formed on a first surface 204*a* of NBL 204. A middle p-type layer 208 can be formed on a first surface 206*a* of PBL 206.

A combination of epitaxial layers and well regions can be formed over a first surface 208*a* of middle p-type layer 208. For example, and as illustrated in FIG. 2, first, second and third p-type well regions 210*a*, 210*b*, 210*c* are formed on first surface 208*a* of middle p-type layer 208 and first and second n-type epitaxial layers 212*a*, 212*b* are formed on first surface 208*a*. First n-type epitaxial layer 212*a* is formed between first and second p-type well regions 210*a*, 210*b* and second n-type epitaxial layer 212*b* is formed between second and third p-type well regions 210*b*, 210*c*.

A first n-type well region 214*a* is formed extending into first n-type epitaxial layer 212*a* and a second n-type well region 214*b* is formed extending into second n-type epitaxial layer 212*b*. A first n-type LDD implant (NE) region 220*a* is formed extending into first n-type well 214*a* and a first n-type (N+) source (NP) region 22*a* is formed extending into first NE region 220*a*. A second NE region 220*b* is formed extending into both, a portion of n-type epitaxial layer 212*b* and a portion of second n-type well region 214*b*. A third NE region 220*c* is formed extending into third p-type well region 210*c* and a second NP region 222*b* is formed extending into third NE region 220*c*.

Erase capacitor 200 further includes a first shallow trench isolation (STI) region 216*a* formed extending into a portion of first p-type well region 210*a* and a second STI region 216*b* is formed extending into a portion of both first p-type well region 210*a* and first n-type epitaxial layer 212*a* such that it is formed over a border region between first p-type well region 210*a* and first n-type epitaxial layer 212*a*. A p-type (P+) source region/p-type LDD implant (PP/PE) region 218 is formed between first and second STI regions 216*a*, 216*b* and extending into a portion of first p-type well region 210*a*.

A third STI region 216*c* is formed extending into a portion of both, second n-type well region 214*b* and second n-type epitaxial layer 212*b*. In an embodiment, third STI region 216*c* is formed adjacent to second NE region 220*b*.

In erase capacitor 200, a first, second and third gate polysilicon regions 224a, 224b, 224c are formed. First gate polysilicon region 224 224a is formed over a portion of a first surface of second STI region 216b and a portion of first n-type well region 214a. Second gate polysilicon region 224b is formed over a first surface of second p-type well region 210b. In an embodiment, second gate polysilicon region 224b may be formed such that it is disposed over the entire first surface of second p-type well region 210b. Third gate polysilicon region 224c is formed over a portion of a first surface of third STI region 216c, a portion of a first surface of second n-type epitaxial layer 212b and a portion of a first surface of third p-type well region 210c.

An inter-level dielectric (ILD) layer 226 is formed over the first surfaces of each of first, second and third STI regions, 216a, 216b, 216c, PP/PE region 218, first, second and third gate polysilicon regions 224a, 224b, 224c, first and second NP regions 222a, 222b and first and second NE regions 220a, 220b.

First, second and third vias 228a, 228b, 228c are formed extending through ILD layer 226 such that they extend from a first surface 226a of ILD layer 226 to a second surface 226b of ILD layer 226. A metallization can be deposited in each of first, second and third vias 228a, 228b, 228c, which couple metal contact pads to different regions within erase capacitor 200. For example, a first metal contact pad 230a is formed over a first end of first via 228a and a second end of via 228a is in contact with first NP region 222a. A second metal contact pad 230b is formed over a first end of second via 228b and a second end of second via 228b is in contact with third gate polysilicon region 224c. A third metal contact pad 228c is formed over a first end of third via 228c and a second end of third via 228c is in contact with second NP region 222b.

In an embodiment, first metal contact pad 230a can be an erase/discharge terminal, second metal contact pad 230b can be a select gate and third metal contact pad 230c can be a source gate.

Figure 3:
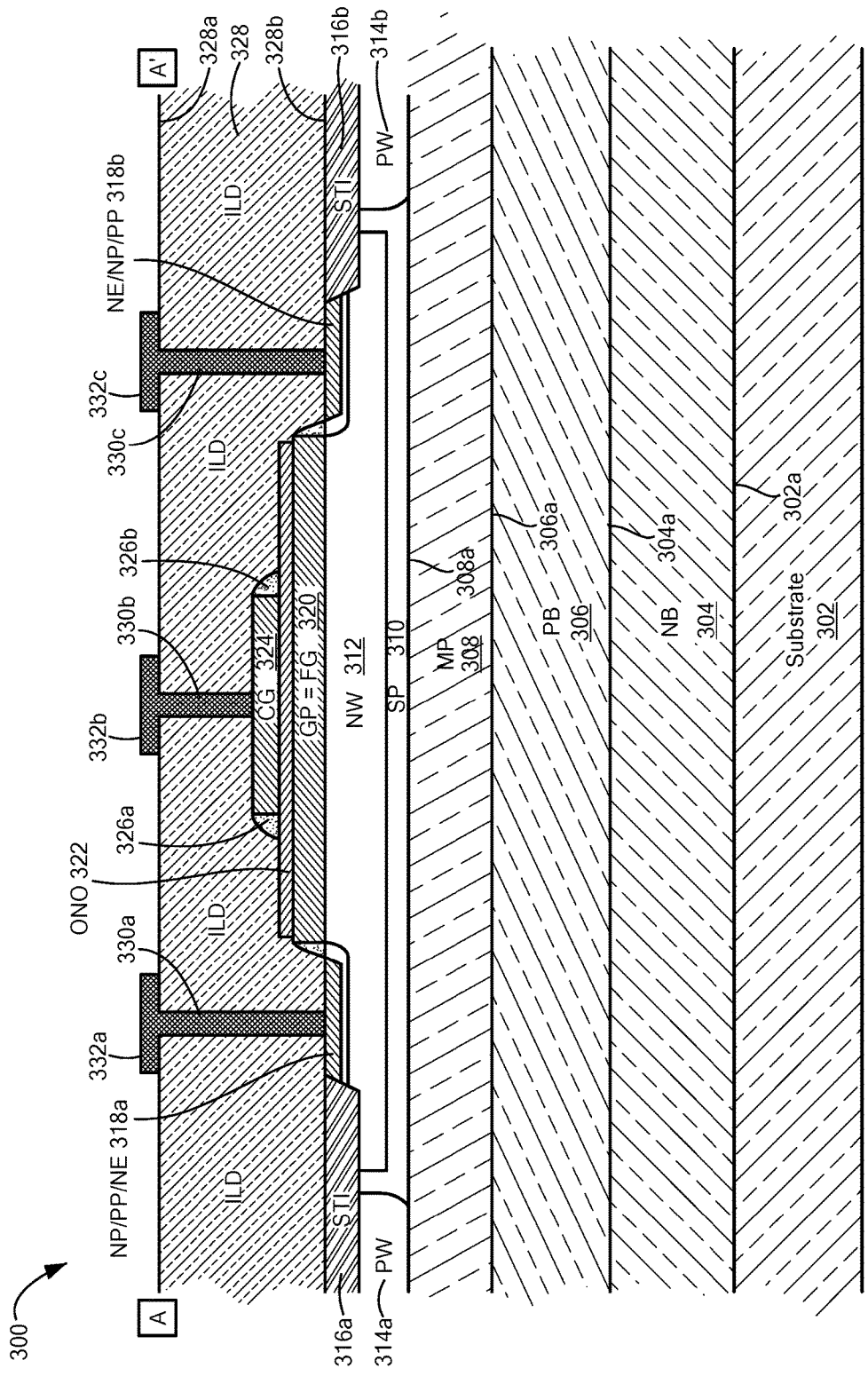
FIG. 3 shows a cross section of a programming capacitor of the HYBRID EEPROM OF FIG. 1.

Now referring to FIG. 3, a hybrid programming capacitor 300, that may be the same or substantially similar to hybrid programming region 102, is provided.

Hybrid programming capacitor 300 can be formed on a substrate 302. A n-type buried layer 304 can be formed on a first surface 302a of substrate 302. A p-type buried layer 306 can be formed on a first surface 304a of n-type buried layer 304. A middle p-type layer 308 can be formed on a first surface 306a of p-type buried layer 306.

A first and second p-type well regions 314a, 314b and a n-type epitaxial layer 310 can be formed on a first surface 308a of middle p-type layer 308. For example, n-type epitaxial layer 310 is formed between first and second p-type well regions 314a, 314b. A n-type well region 312 is formed extending into n-type epitaxial layer 310.

A first STI region 316a can be formed extending into portions of first p-type well region 314a, n-type epitaxial layer 310 and n-type well region 312 and a second STI region 316b can be formed extending into portions of second p-type well region 314b, n-type epitaxial layer 310 and n-type well region 312. In an embodiment, first and second STI regions 316a, 316b can be formed at opposing ends of hybrid programming capacitor 300.

A first NP/PP/NE region 318a can be formed extending into n-type well region 312 and adjacent to first STI region 316a. A second NE/NP/PP region 318b can be formed extending into n-type well region 312 and adjacent to second STI region 316b. Thus, first and second NP/PP/NE regions 318a, 318b can be formed at opposing ends of n-type well region 312 and be spaced apart from each other at a distance corresponding to a length of a gate polysilicon layer 320.

Gate polysilicon layer 320 can be formed on a first surface 312a of n-type well region 312. An oxide-nitride-oxide (ONO) layer 322 can be formed on a first surface 320a of gate polysilicon layer 320 and a control gate polysilicon layer 324 can be formed on a first surface 322a of ONO layer 322. In an embodiment, gate polysilicon layer 320 can be referred to herein as a first polysilicon layer and include a floating gate of hybrid programming capacitor 300. Control gate polysilicon layer 324 can be referred to herein as a second polysilicon layer.

An ILD layer 328 can be formed on a first surface of each of first and second STI regions 316a, 316b, a first surface of first and second NP/PP/NE regions 318a, 318b, first surface 322a of ONO layer 322 and a first surface 324a of control gate polysilicon layer 324.

First, second and third vias 330a, 330b, 330c are formed extending through ILD layer 328 such that they extend from a first surface 328a of ILD layer 328 to a second surface 328b of ILD layer 226. A metallization can be deposited in each of first, second and third vias 330a, 330b, 330c which couple metal contact pads to different regions within hybrid programming capacitor 300. For example, a first metal contact pad 332a is formed over a first end of first via 330a and a second end of via 330a is in contact with first NP/PP/NE region 318aa 318a. A second metal contact pad 332bb 332b is formed over a first end of second via 330b and a second end of second via 330b is in contact with control gate polysilicon layer 324. A third metal contact pad 332c is formed over a first end of third via 330c and a second end of third via 330c is in contact with second NE/NP/PP region 318b.

In an embodiment, first metal contact pad 332a can be a floating gate terminal, second metal contact pad 332b can be a control gate terminal and third metal contact pad 332c can be a floating gate terminal. In single EEPROM operation, in order to program a hybrid EEPROM cell (e.g., FIG. 1, a hybrid EEPROM cell 100 of FIG. 1), first and/or third metal contact pads 332a, 332c can be used to test, program and/or erase from the hybrid EEPROM cell.

For example, to program the hybrid EEPROM cell as a single polysilicon EEPROM, a voltage and/or voltage pulse can be applied to first and/or third metal contact pads 332a, 332c (e.g., sweep voltage from a first voltage (e.g., 0 V) to a second, different voltage (e.g., 10 V)) and a corresponding current can be measured (e.g., measure $I_{DS}$ and trigger $V_t$ at $I_{DS}$), with a bias voltage applied to a drain node, a source node coupled to ground, a negative reference voltage applied to a body node and a positive reference voltage applied to a select gate.

To erase from the hybrid EEPROM cell as a single polysilicon EEPROM, a voltage and/or voltage pulse can be applied to first and/or third metal contact pads 332a, 332c (e.g., sweep voltage from a negative first voltage to a second, different positive voltage) and a corresponding current can be measured (e.g., measure $I_{DS}$ and trigger $V_t$ at $I_{DS}$), with a bias voltage applied to a drain node, a source node coupled to ground, a negative reference voltage applied to a body node and a positive reference voltage applied to a select gate.

However, as previously stated, the hybrid EEPROM cells described herein can operate as both a single polysilicon EEPROM and a double polysilicon EEPROM. Thus, to program to the hybrid EEPROM cell as a double polysilicon EEPROM, a voltage and/or voltage pulse can be applied to second metal contact pad 332b (e.g., sweep voltage from a zero-voltage (or first positive voltage) to a second, different negative voltage) and a corresponding current can be measured (e.g., measure $I_{DS}$ and trigger $V_t$ at $I_{DS}$), with a bias voltage applied to a drain node, a source node coupled to ground, a negative reference voltage applied to a body node and a positive reference voltage applied to a select gate.

To erase from the hybrid EEPROM cell as a double polysilicon EEPROM, a voltage and/or voltage pulse can be applied to second metal contact pads 332b (e.g., sweep voltage from a negative first voltage to a second, different positive voltage) and a corresponding current can be measured (e.g., measure $I_{DS}$ and trigger $V_t$ at $I_{DS}$), with a bias voltage applied to a drain node, a source node coupled to ground, a negative reference voltage applied to a body node and a positive reference voltage applied to a select gate.

It should be appreciated that the above description is one embodiment of testing, programming and erase techniques that can be performed using the hybrid EEPROM cells described herein and that other testing, programming and erase techniques can be used, for example but not limited to, techniques known for individual single polysilicon EEPROM cells and/or individual double polysilicon EEPROM cells, as are generally known.

Figure 4:
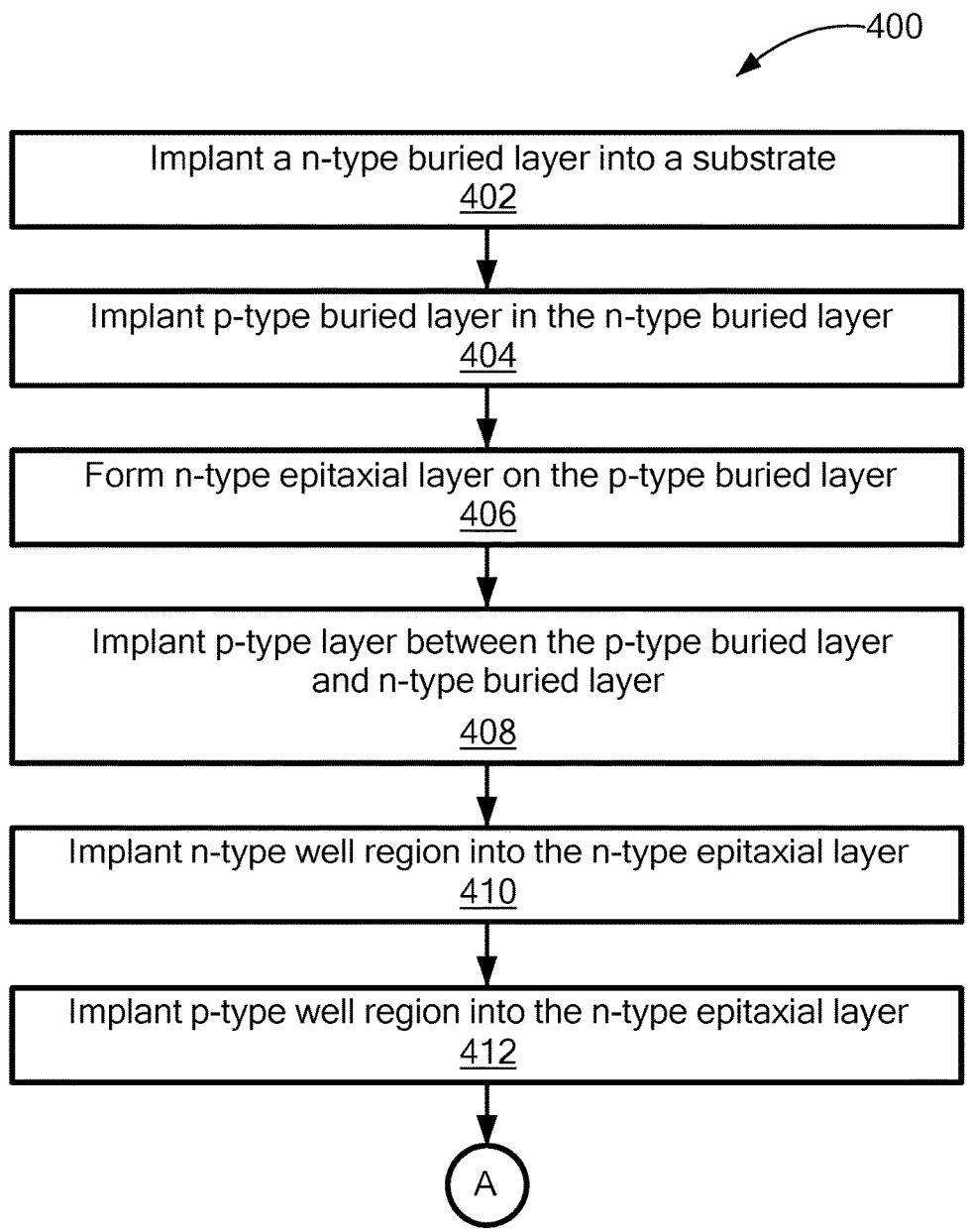
FIGS. 4-4C are a flow diagram of a method of forming the HYBRID EEPROM OF FIG. 1.
Figure 4A:
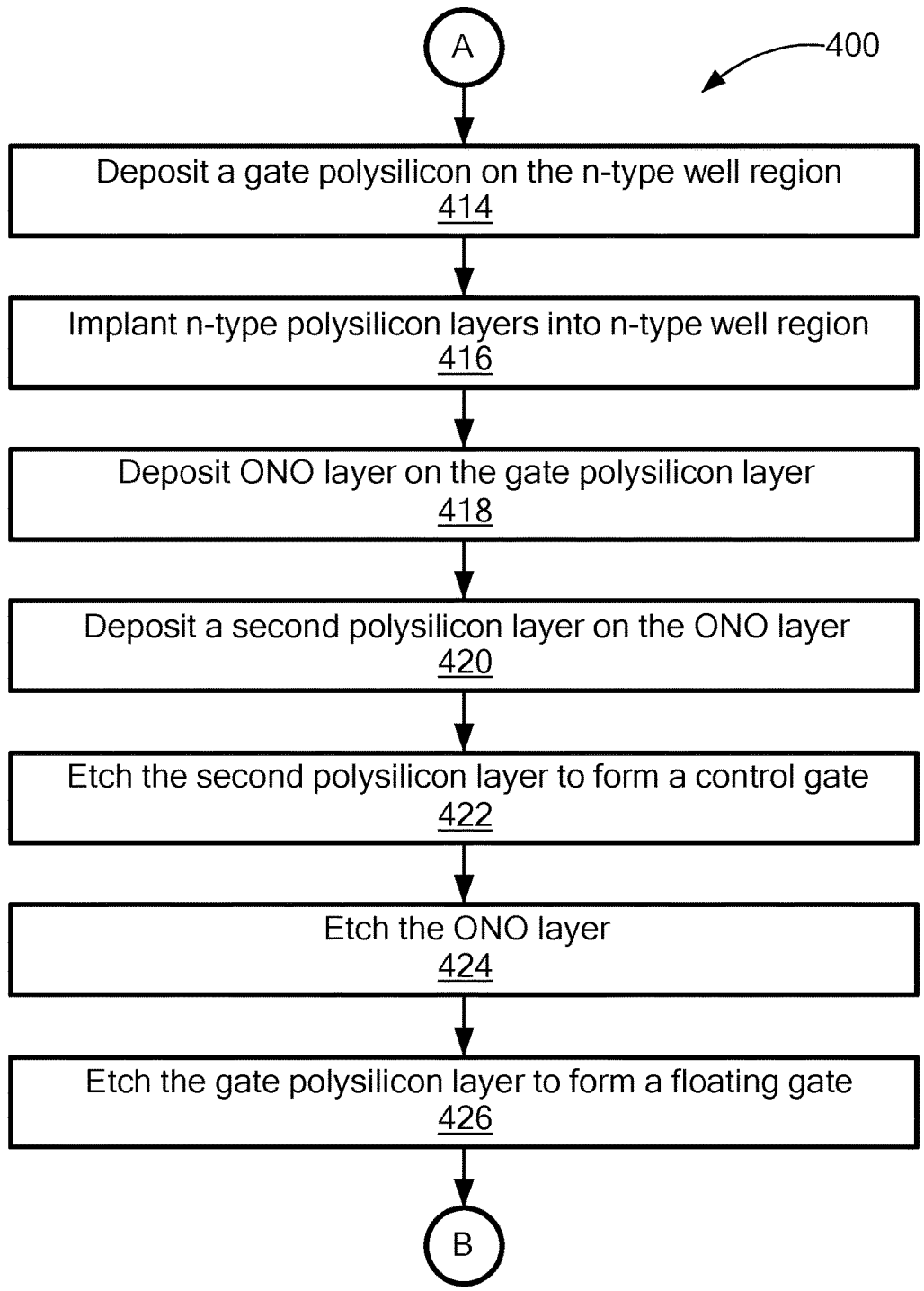
Figure 4B:
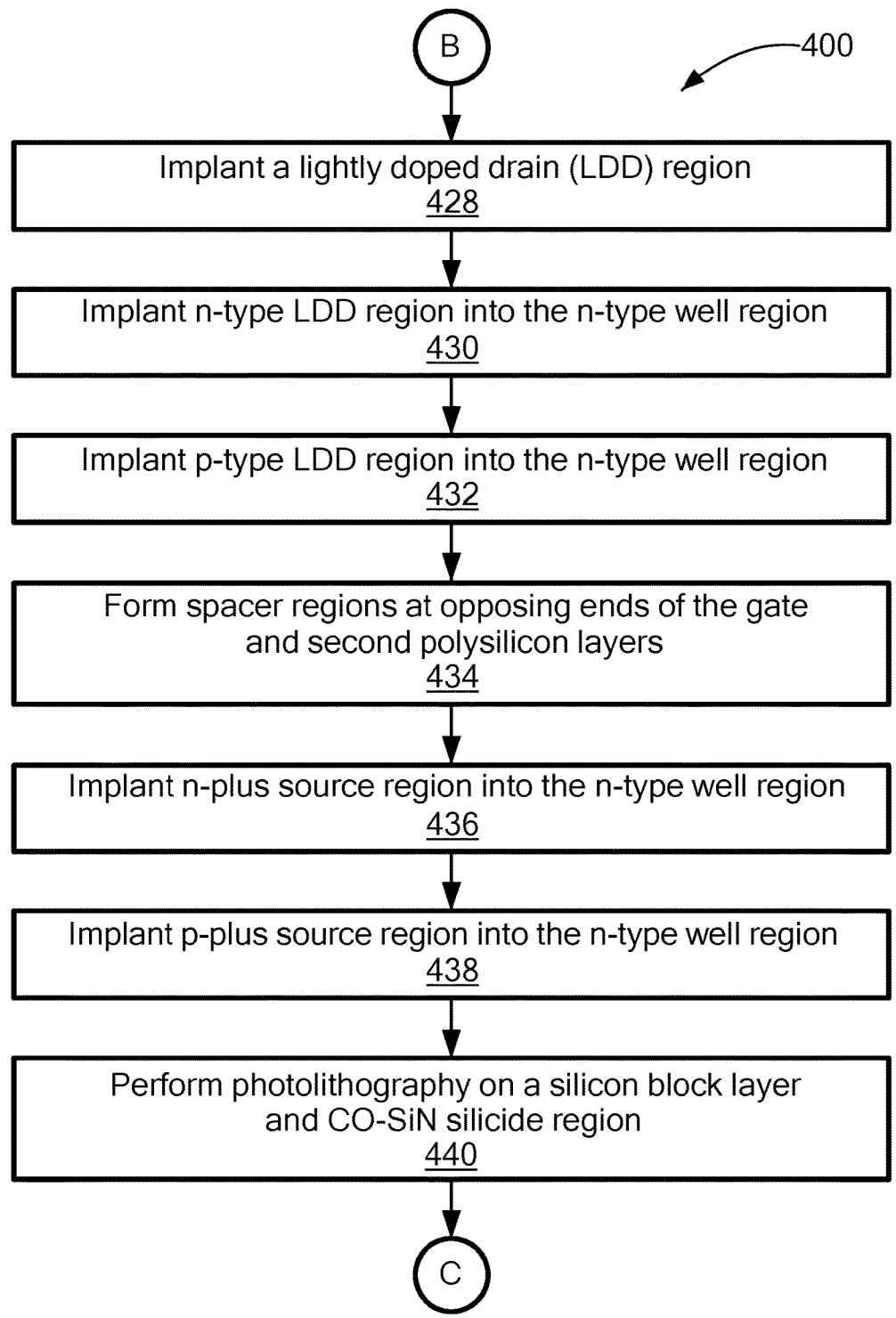
Figure 4C:
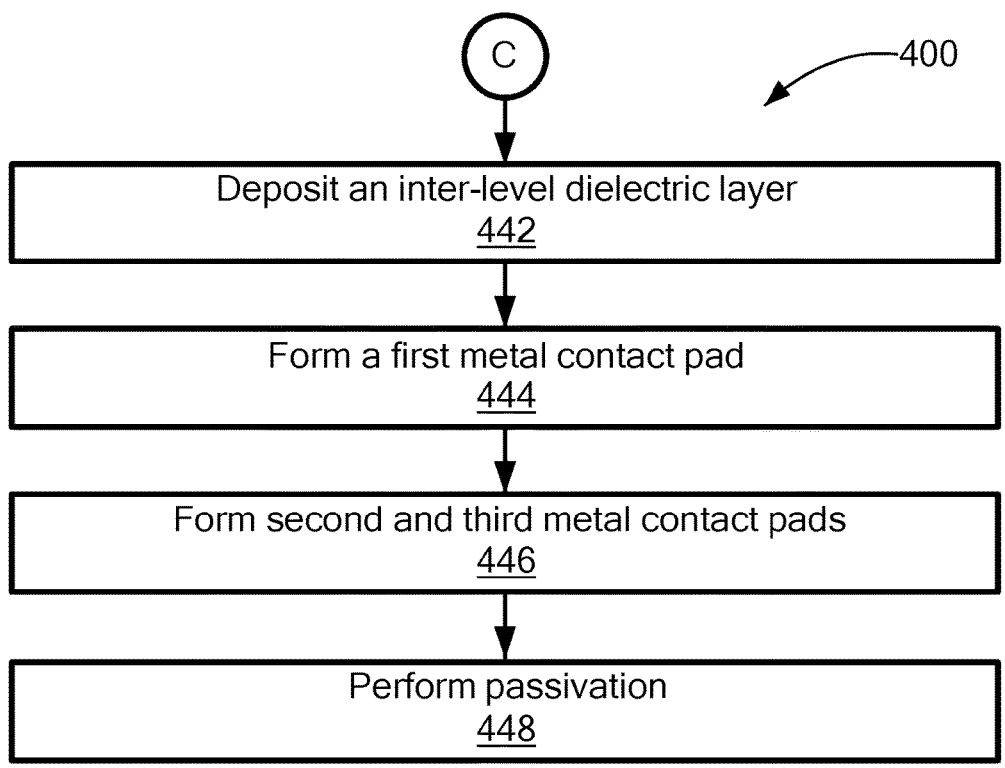

Now referring to FIGS. 4-4C, a method for forming a hybrid programming capacitor begins at block 402 by implanting a n-type buried layer into a substrate, here a p-type substrate. At block 404, a p-type buried layer is implanted into the n-type buried layer. At block 406, a n-type epitaxial layer is formed on a surface of the p-type buried layer. At block 408, a middle p-type layer can be implanted such that it is disposed between the p-type buried layer and the n-type epitaxial layer.

At block 410, a n-type well region can be implanted into the n-type epitaxial layer. A block 412, a p-type well region can be implanted into the n-type epitaxial layer. In some embodiments, first and second p-type well regions are implanted into the n-type epitaxial layer such that they are disposed at opposite ends of the n-type well region.

At block 414, a gate polysilicon layer (or first polysilicon layer) can be deposited on a surface of the n-type well region. The gate polysilicon layer may include a 90A gate oxidation layer. In an embodiment, the gate polysilicon layer can be utilized as a floating gate in the hybrid programming capacitor and can form a single polysilicon EEPROM.

At block 416, first and second n-type polysilicon layers are implanted into n-type well region. The first and second n-type polysilicon layers are spaced apart from each other by a distance approximately equal to a length of the gate polysilicon layer.

At block 418, an ONO layer can be deposited on a surface of the gate polysilicon layer. The ONO layer can be formed over an entire first surface of the gate polysilicon layer. In other embodiments, the ONO layer can be formed over a portion of the first surface of the gate polysilicon layer.

At block 420, a second polysilicon layer can be deposited on a first surface of the ONO layer. At block 422, etching can be performed on the second polysilicon layer to form a control gate within the hybrid programming capacitor. Thus, the second polysilicon layer can be utilized as a control gate of the hybrid programming capacitor, for example, for a control gate of a double polysilicon EEPROM.

At block 424, etching can be performed on the ONO layer.

At block 426, etching can be performed on the gate polysilicon layer (e.g., first polysilicon layer) to form a floating gate within the hybrid programming capacitor. Thus, the gate polysilicon layer can be utilized as a floating gate of the hybrid programming capacitor, for example, as a floating gate of a single or double polysilicon EEPROM. In an embodiment, the combination of the first and second polysilicon layers can form a double polysilicon EEPROM in the hybrid programming capacitor.

At block 428, a LDD oxide layer can be implanted. At block 430, a NE region can be implanted into the n-type well region. At block 432, a PE region can be implanted into the n-type well region.

At block 434, spacer regions can be formed at opposing ends of each of the gate polysilicon layer and the second polysilicon layer. For example, a first set of spacer regions can be on the first surface of each of the first and second NE/PP/NE regions such that they are at opposing ends of the gate polysilicon layer and surround the gate polysilicon layer. A second set of spacer regions can be formed on the first surface of the ONO layer such that they are at opposing ends of the second polysilicon layer and surround the second polysilicon layer.

Oxide spacers 120a, 120b, which can be deposited on the surface 106a of the N-epi layer 106, generally surround the gate oxide layer 116 and the polysilicon layer 118. At block 436 a NP region can be implanted into the n-type well region. At block 438, a PP region can be implanted into the n-type well region. At block 440, a photolithography can be performed on a silicon block layer (SB) region and a CO—SiN silicide region.

At block 442, an ILD region can be deposited on surfaces of the STI regions, NP/PP/NE regions, the ONO layer and the second polysilicon layer. At block 444, a first metal contact pad can be formed on a first surface of the ILD region.

At block 446, a second and third metal contact pads can be formed on the first surface of the ILD region. Vias can be formed through the ILD layer to connect each of the first, second and third metal contact pads to different surfaces within the hybrid programming capacitor and metallization can be deposited into each of the vias. For example, a first via can be formed extending through ILD region and from first metal contact pad to first NP/PP/NE region, a second via can be formed extending through ILD region and from second metal contact pad to second polysilicon layer (i.e., control gate), and a third via can be formed extending through ILD region and from third metal contact pad to second NP/PP/NE region.

At block 448, passivation can be performed. For example, in some embodiments, a coating or protective layer may be disposed over hybrid EEPROM cell to protect hybrid EEPROM cell from various environmental hazards (e.g., erosion, moisture, etc.) and/or physical damage.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:
1. A hybrid electrically erasable programmable read only memory (EEPROM) cell comprising:
 a programming region comprising:
  a programmable capacitor disposed on a substrate, the programmable capacitor comprising:
   a floating gate forming a first polysilicon layer, the floating gate having first and second opposing surfaces; and an oxide-nitride-oxide (ONO) layer having disposed over the first surface of the floating gate, the ONO layer having first and second opposing surfaces;

a first metal contact coupled to a first implant region through a first via, the first implant region formed adjacent the first polysilicon layer;

a control gate forming a second polysilicon layer, the control gate formed over the first surface of the ONO layer to form a hybrid EEPROM comprising a single polysilicon EEPROM and a double polysilicon EEPROM, the single polysilicon EEPROM comprising the first polysilicon layer and the double polysilicon EEPROM comprising the first and second polysilicon layers; and a second metal contact formed above the first polysilicon layer and in contact with the second polysilicon layer through a second via; and a drain region coupled to the programming region through a liner region, wherein the drain region is configured to operate as a drain node or a read node for the hybrid EEPROM cell;

wherein the first metal contact and the drain node are configured to be used to program the single polysilicon EEPROM;

wherein the second metal contact and the first metal contact are configured to be used to program the double polysilicon EEPROM; and wherein the read node of the drain region is configured to be used to read from the hybrid EEPROM cell.

2. The hybrid EEPROM cell of claim 1, wherein the second surface of the floating gate is formed over an n-type region.

3. The hybrid EEPROM cell of claim 2, wherein the n-type region is formed over a n-type epitaxial layer having first and second p-type well regions formed on either side of the n-type region, wherein the n-type epitaxial layer is formed over a middle p-type layer, wherein the middle p-type layer is formed over a p-type buried layer, and wherein the p-type buried layer is formed over a n-type buried layer.

4. The hybrid EEPROM cell of claim 2, wherein the first implant region comprises a second n-type region having a different doping than the n-type region.

5. The hybrid EEPROM cell of claim 4, wherein the first implant region comprises a n-type lightly-doped drain (LDD) implant.

6. The hybrid EEPROM cell of claim 4, wherein the first implant region comprises n-type (N+) source.

7. The hybrid EEPROM cell of claim 4, wherein the first implant region extends into the n-type region.

8. The hybrid EEPROM cell of claim 1, further comprising a third metal contact coupled to a second implant region through a third via, the second implant region formed adjacent the floating gate on a second side of the first polysilicon layer opposite the first implant region.

9. The hybrid EEPROM cell of claim 8, further comprising an inter-level dielectric (ILD) layer formed on the first implant region, the second implant region, the ONO layer, and the second polysilicon layer.

10. The hybrid EEPROM cell of claim 9, wherein the ILD layer is formed between the first via and the second via, and wherein the ILD layer is formed between the second via and the third via.

11. A method for forming a hybrid electrically erasable programmable read only memory (EEPROM) cell, the method comprising:

forming a programming region having a programmable capacitor disposed on a substrate, wherein forming the programming region comprises:

forming a floating gate having a first polysilicon layer, the floating gate having first and second opposing surfaces;

implanting a first implant region formed adjacent the first polysilicon layer;

disposing an oxide-nitride-oxide (ONO) layer over the first surface of the floating gate, the ONO layer having first and second opposing surfaces; and forming a control gate having a second polysilicon layer, the control gate formed over the first surface of the ONO layer to form a hybrid EEPROM comprising a single polysilicon layer and a double polysilicon EEPROM, the single polysilicon EEPROM comprising the first polysilicon layer and the double polysilicon EEPROM comprising the first and second polysilicon layers;

coupling a drain region to the programming region through a liner region, wherein the drain region is configured to operate as a drain node or a read node for the hybrid EEPROM cell;

forming a first metal contact coupled to the first implant region through a first via, wherein the first metal contact and the drain node are configured to be used to program the single polysilicon EEPROM; and forming a second metal contact above the first polysilicon layer and in contact with the second polysilicon layer through a second via, wherein the second metal contact and the first metal contact are configured to be used to program the double polysilicon EEPROM.

12. The method of claim 11, further comprising an n-type region over which the second surface of the floating gate is formed.

13. The method of claim 12, further comprising
forming an n-type buried layer on the substrate;
forming a p-type buried layer over the n-type buried layer;
forming a middle p-type layer over the p-type buried layer;
forming an n-type epitaxial layer over the middle p-type layer; and
forming first and second p-type well regions formed on either side of the n-type region;
wherein the n-type region is formed over a n-type epitaxial layer having first and second p-type well regions formed on either side of the n-type region, wherein the n-type epitaxial layer is formed over a middle p-type layer, wherein the middle p-type layer is formed over a p-type buried layer, and wherein the p-type buried layer is formed over a n-type buried layer.

14. The method of claim 11, further comprising
forming a second implant region adjacent the floating gate on a second side of the first polysilicon layer opposite the first implant region; and
forming a third metal contact coupled to the second implant region through a third via.

15. The method of claim 14, further comprising forming an inter-level dielectric (ILD) layer on the first implant region, the second implant region, the ONO layer, and the second polysilicon layer.

16. The method of claim 15, wherein the ILD layer is formed between the first via and the second via, and wherein the ILD layer is formed between the second via and the third via.

17. A hybrid electrically erasable programmable read only memory (EEPROM) cell comprising:

a programming means comprising a programming capacitor disposed on a substrate, the programming capacitor comprising:
- a first means for modifying the memory cell having a first polysilicon layer, the first means for modifying having first and second opposing surfaces;
- a means for isolating disposed over the first surface of the first means for modifying, the means for isolating having first and second opposing surfaces;
- a first contact means coupled to a first implant region formed adjacent the first polysilicon layer;
- a second means for modifying the memory cell having a second polysilicon layer and disposed over the first surface of the means for isolating to form a hybrid EEPROM comprising a single polysilicon layer and a double polysilicon EEPROM, the single polysilicon EEPROM comprising the first polysilicon layer and the double polysilicon EEPROM comprising the first and second polysilicon layers;
- a second contact means formed above the first polysilicon layer and in contact with the second polysilicon layer; and a drain means coupled to the programming means through a liner region, wherein the drain means is configured to operate as a drain node or a read node for the hybrid EEPROM cell;

wherein the first contact means and the drain node are configured to be used to program the single polysilicon EEPROM;

wherein the second contact means and the first contact means are configured to be used to program the double polysilicon EEPROM.

18. The hybrid EEPROM cell of claim 17, wherein the second surface of the first means for modifying the memory cell is formed over an n-type region.

19. The hybrid EEPROM cell of claim 18, wherein the n-type region is formed over a n-type epitaxial layer having first and second p-type well regions formed on either side of the n-type region, wherein the n-type epitaxial layer is formed over a middle p-type layer, wherein the middle p-type layer is formed over a p-type buried layer, and wherein the p-type buried layer is formed over a n-type buried layer.

20. The hybrid EEPROM cell of claim 19, wherein the first implant region comprises a second n-type region having a different doping than the n-type region.

21. The hybrid EEPROM cell of claim 20, wherein the first implant region comprises a n-type lightly-doped drain (LDD) implant.

22. The hybrid EEPROM cell of claim 20, wherein the first implant region comprises n-type (N+) source.

23. The hybrid EEPROM cell of claim 17, further comprising a third metal contact coupled to a second implant region through a third via, the second implant region formed adjacent the first means for modifying the memory cell on a second side of the first polysilicon layer opposite the first implant region.

24. The hybrid EEPROM cell of claim 23 further comprising an inter-level dielectric (ILD) layer formed on the first implant region, the second implant region, the ONO layer, and the second polysilicon layer.

25. The hybrid EEPROM cell of claim 24, wherein the ILD layer is formed between the first via and the second via, and wherein the ILD layer is formed between the second via and the third via.

* * * * *

UNITED STATES PATENT AND TRADEMARK OFFICE
CERTIFICATE OF CORRECTION

PATENT NO. : 10,297,605 B2  
APPLICATION NO. : 15/913286  
DATED : May 21, 2019  
INVENTOR(S) : Yigong Wang Page 1 of 1

It is certified that error appears in the above-identified patent and that said Letters Patent is hereby corrected as shown below:

In the Specification

Column 1, Line 8 delete "is continuation" and replace with --is a continuation--.

Column 1, Line 52 delete "EEMPROM" and replace with --EEPROM--.

Column 8, Line 10 delete ", a at" and replace with --, at--.

Column 8, Line 46 delete "22a" and replace with --222a--.

Column 9, Line 3 delete "region 224 224a" and replace with --region 224a--.

Column 10, Line 21 delete "layer 226." and replace with --layer 328.--.

Column 10, Line 27 delete "region 318aa 318a" and replace with --region 318a--.

Column 10, Line 28 delete "332bb 332b" and replace with --332b--.

Column 11, Line 34 delete ". A block 412," and replace with --. At block 412,--.

Column 11, Line 41 delete "a 90A gate" and replace with --a gate--.

Column 12, Line 32 delete "a second" and replace with --second--.

Signed and Sealed this  
Seventeenth Day of December, 2019

Andrei Iancu  
*Director of the United States Patent and Trademark Office*